US012794245B2

(12) United States Patent
Kam

(10) Patent No.: US 12,794,245 B2
(45) Date of Patent: Nov. 10, 2026

(54) BATTERY MANAGEMENT METHOD, BATTERY MANAGEMENT DEVICE AND BATTERY PACK PERFORMING THE SAME

(71) Applicant: SAMSUNG SDI CO., LTD., Yongin-si (KR)

(72) Inventor: Jaewoo Kam, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 596 days.

(21) Appl. No.: 18/378,950

(22) Filed: Oct. 11, 2023

(65) Prior Publication Data

US 2024/0204537 A1 Jun. 20, 2024

(30) Foreign Application Priority Data

Dec. 20, 2022 (KR) ........................ 10-2022-0179661

(51) Int. Cl.
*H02J 7/00* (2026.01)
*G01R 31/3835* (2019.01)
(Continued)

(52) U.S. Cl.
CPC ............ *H02J 7/52* (2026.01); *G01R 31/3835* (2019.01); *H01M 10/4221* (2013.01);
(Continued)

(58) Field of Classification Search
CPC ........................................................ H02J 7/52
(Continued)

(56) References Cited

U.S. PATENT DOCUMENTS

2011/0140650 A1* 6/2011 Zhang ...................... B60L 58/22 320/118
2012/0086400 A1 4/2012 White et al.
2012/0319658 A1 12/2012 White et al.
2015/0070024 A1* 3/2015 Kim ..................... G01R 31/392 324/430
2016/0291683 A1* 10/2016 Kacker ................... G06F 1/263
(Continued)

FOREIGN PATENT DOCUMENTS

JP 2014-011060 A 1/2014
JP 2016-102674 A 6/2016
(Continued)

OTHER PUBLICATIONS

Extended European Search Report dated Jun. 12, 2024, for corresponding European Patent Application No. 23216562.1.
Japanese Office Action dated Nov. 18, 2024, of the corresponding Japanese Patent Application No. 2023-143730.

*Primary Examiner* — Yalkew Fantu
(74) *Attorney, Agent, or Firm* — Lee IP Law, P.C.

(57) ABSTRACT

A battery management device for a battery pack having a plurality of battery modules, includes a detection device detecting state information of battery cells included in the plurality of battery modules, and a control device entering a replacement mode and performing balancing of the plurality of battery modules if at least one battery module among the plurality of battery modules is replaced, activating a first protection function performing a protection operation according to the state imbalance in each battery module while operating in the replacement mode, detecting an imbalance state of cell voltage or state of charge for each of the plurality of battery modules based on the state information if the first protection function is activated, and executing the protection operation if a battery module in the imbalance state satisfies a predetermined first condition is detected among the plurality of battery modules.

20 Claims, 4 Drawing Sheets

(51) Int. Cl.

| | |
|---|---|
| ***H01M 10/42*** | (2006.01) |
| ***H01M 10/44*** | (2006.01) |
| ***H01M 10/48*** | (2006.01) |
| ***H02J 7/52*** | (2026.01) |
| ***H02J 7/82*** | (2026.01) |
| *H02J 7/60* | (2026.01) |

(52) U.S. Cl.
CPC ....... *H01M 10/425* (2013.01); *H01M 10/441* (2013.01); *H01M 10/482* (2013.01); *H02J 7/82* (2026.01); *H01M 2010/4271* (2013.01); *H02J 7/60* (2026.01)

(58) Field of Classification Search
USPC .......................................................... 320/118
See application file for complete search history.

(56) References Cited

U.S. PATENT DOCUMENTS

| | | | | |
|---|---|---|---|---|
| 2019/0058336 | A1 * | 2/2019 | Thompson | ............. B60L 58/12 |
| 2020/0169115 | A1 | 5/2020 | Yasoshima et al. | |
| 2020/0399856 | A1 | 12/2020 | Watanabe et al. | |
| 2022/0278534 | A1 | 9/2022 | Kim et al. | |

FOREIGN PATENT DOCUMENTS

| | | | |
|---|---|---|---|
| JP | 2017-200125 | A | 11/2017 |
| JP | 2017-212832 | A | 11/2017 |
| JP | 2020-005407 | A | 1/2020 |
| KR | 10-2013-0130949 | A | 12/2013 |
| KR | 10-1642329 | B1 | 7/2016 |

* cited by examiner

BATTERY MANAGEMENT METHOD, BATTERY MANAGEMENT DEVICE AND BATTERY PACK PERFORMING THE SAME

CROSS-REFERENCE TO RELATED APPLICATION

Korean Patent Application No. 10-2022-0179661, filed in the Korean Intellectual Property Office on Dec. 20, 2022, is incorporated herein by reference in its entirety.

BACKGROUND

1. Field

A battery management method, a battery management device, and a battery pack performing the same is disclosed.

2. Description of the Related Art

A secondary battery differs from a primary battery, which only provides non-reversible conversion of chemicals to electrical energy, in that it can be charged and discharged repeatedly.

SUMMARY

Embodiments are directed to a battery management device for a battery pack including a plurality of battery modules, including a detection device detecting state information of battery cells included in the plurality of battery modules, and a control device entering a replacement mode and performing balancing of the plurality of battery modules if at least one battery module among the plurality of battery modules is replaced, activating a first protection function performing a protection operation according to the state imbalance in each battery module while operating in the replacement mode, detecting an imbalance state of cell voltage or state of charge for each of the plurality of battery modules based on the state information if the first protection function is activated, and executing the protection operation if a battery module in the imbalance state satisfies a predetermined first condition is detected among the plurality of battery modules.

In embodiments, the battery management device may include the control device obtaining a voltage difference between a battery cell having a maximum cell voltage and a battery cell having a minimum cell voltage for each of the plurality of battery modules if the first protection function is activated, and executing the protection operation if a battery module having a voltage difference greater than a threshold value is detected among the plurality of battery modules.

In embodiments, the battery management device may include the control device obtaining a state of charge difference between a battery cell having a maximum state of charge and a battery cell having a minimum state of charge for each of the plurality of battery modules if the first protection function is activated, and executing the protection operation if a battery module having the state of charge difference greater than a threshold value is detected among the plurality of battery modules.

In embodiments, the battery management device may include the control device operating in a normal mode before the at least one battery module is replaced or after balancing of the plurality of battery modules is completed in the replacement mode, and activating a second protection function for performing the protection operation according to a state imbalance in the battery pack while operating in the normal mode, and detecting an imbalance state of cell voltage or state of charge in all the plurality of battery modules based on the state information if the second protection function is activated, and executing the protection operation if the imbalance state in cell voltage or state of charge in all the plurality of battery modules satisfies a predetermined second condition, and if the second protection function is activated.

In embodiments, the battery management device may include the control device obtaining a voltage difference between a battery cell having a maximum cell voltage and a battery cell having a minimum cell voltage in all the plurality of battery modules if the second protection function is activated, and executing the protection operation if the voltage difference is greater than a threshold value.

In embodiments, the battery management device may include the control device obtaining a state of charge difference between a battery cell having a maximum state of charge and a battery cell having a minimum state of charge in all the plurality of battery modules if the second protection function is activated, and executing the protection operation if the state of charge difference is greater than a threshold value.

In embodiments, the battery management device may include the control device deactivating the second protection function while operating in the replacement mode.

In embodiments, the battery management device may include the control device deactivating the second protection function by not executing a function for performing the second protection function while operating in the replacement mode.

In embodiments, the battery management device may include the control device deactivating the second protection function by raising a threshold value for the second condition while operating in the replacement mode so that the protection operation is not executed.

In embodiments, the battery management device may include the control device deactivating the first protection function while operating in the normal mode.

In embodiments, the battery management device may include the control device detecting replacement of a battery module based on replacement information received from at least one of an input device, an external terminal, or an upper controller.

In embodiments, the battery management device may include the control device detecting replacement of a battery module by comparing identification information received from the plurality of battery modules with pre-stored identification information.

In embodiments, the battery management device may include the control device allowing only one of charge and discharge of the plurality of battery modules while operating in the replacement mode.

Embodiments are directed to a battery pack, including a plurality of battery modules connected in series with each other, and a detection device detecting state information of battery cells included in the plurality of battery modules, and a control device entering a replacement mode and performing balancing of the plurality of battery modules if at least one battery module among the plurality of battery modules is replaced, activating a first protection function performing a protection operation according to the state imbalance in each battery module while operating in the replacement mode, detecting an imbalance state of cell voltage or state of charge for each of the plurality of battery modules based on the state information if the first protection function is activated, and executing the protection operation if a battery module in the imbalance state satisfies a predetermined first condition is detected among the plurality of battery modules.

Embodiments are directed to a battery management method for a battery pack including a plurality of battery modules, including switching to a replacement mode if replacement of the battery module is detected, performing balancing of the plurality of battery modules while allowing only one of charge and discharge while operating in the replacement mode, and performing a first protection function including executing a protection operation according to a state imbalance in each battery module while operating in the replacement mode, the performing of the first protection function including obtaining a first imbalance state of cell voltage or state of charge for each of the plurality of battery modules, and executing the protection operation if a battery module in the first imbalance state satisfies a predetermined first condition among the plurality of battery modules.

In embodiments, the battery management method may include the obtaining of the first imbalance state including obtaining a voltage difference between a battery cell having a maximum cell voltage and a battery cell having a minimum cell voltage for each of the plurality of battery modules, or obtaining a state of charge difference between a battery cell having a maximum state of charge and a battery cell having a minimum state of charge for each of the plurality of battery modules, and the executing of the protection operation may include executing the protection operation if a battery module having the voltage difference greater than a threshold value is detected among the plurality of battery modules, or executing the protection operation if a battery module having the state of charge difference greater than a threshold value is detected among the plurality of battery modules.

In embodiments, the battery management method may include operating in a normal mode if the replacement of the battery module is not detected, controlling charge and discharge of the plurality of battery modules according to states of the plurality of battery modules while operating in the normal mode, and performing a second protection function including executing the protection operation according to a state imbalance in all the plurality of battery modules while operating in the normal mode, wherein the performing of the second protection function includes obtaining a second imbalance state of cell voltage or state of charge for all the plurality of battery modules, and executing the protection operation if the second imbalance state satisfies a predetermined second condition.

In embodiments, the battery management method may include the obtaining of the second imbalance state including obtaining a voltage difference between a battery cell having a maximum cell voltage and a battery cell having a minimum cell voltage in all the plurality of battery modules, or obtaining a state of charge difference between a battery cell having a maximum state of charge and a battery cell having a minimum state of charge in all the plurality of battery modules, and the executing of the protection operation may include executing the protection operation if the voltage difference is greater than a threshold value, or executing the protection operation if the state of charge difference is greater than a threshold value.

In embodiments, the battery management method may include deactivating the second protection function while operating in the replacement mode.

In embodiments, the battery management method may include detecting the replacement of a battery module based on replacement information received from at least one of an input device, an external terminal, or an upper controller.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
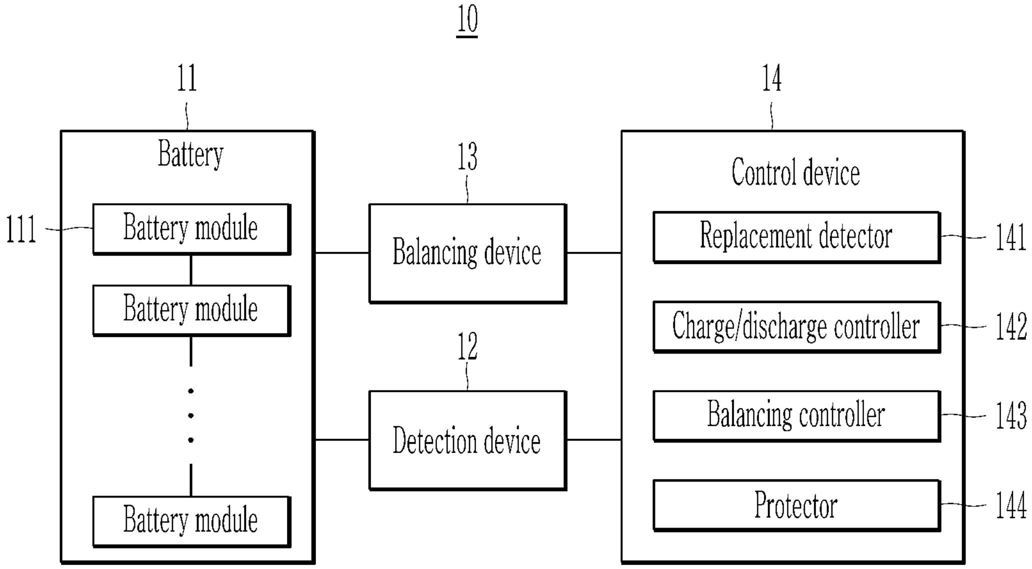
FIG. 1 is a block diagram showing a battery pack according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that if a layer or element is referred to as being "on" another layer or substrate, it can be directly on the other layer or substrate, or intervening layers may also be present. Further, it will be understood that if a layer is referred to as being "under" another layer, it can be directly under, and one or more intervening layers may also be present. In addition, it will also be understood that if a layer is referred to as being "between" two layers, it can be the only layer between the two layers, or one or more intervening layers may also be present. Like reference numerals refer to like elements throughout.

As used herein, the term "and/or" includes any one and any combination of plurality of the associated listed items. When describing embodiments of the present disclosure, the use of "may" means "one or more embodiments of the present disclosure."

As used herein, the singular forms are intended to include the plural forms unless the context clearly indicates otherwise.

Although terms of "first,", "second," and the like are used to explain various constituent elements, the constituent elements are not limited to such terms. These terms are only used to distinguish one constituent element from another constituent element. For example, a first constituent element may be referred to as a second constituent element, and similarly, the second constituent element may be referred to as the first constituent element without departing from the range of the present disclosure.

In this specification, if one constituent element or layer is described as "on," "connected to," or "coupled to" another constituent element or layer, "on," "connected to," and "coupled to" include both directly and as being formed by the interposition of one or more other constituent elements or layers. In addition, if a constituent element or layer is described as being "between" two constituent elements or layers, it should be understood that it is the only constituent element or layer between the two constituent elements or layers, or that there are one or more other intervening components or layers.

Throughout the specification, the term "electrically connected" does not mean only that two constituent elements are directly connected, but may also mean that two constituent elements are indirectly connected through another constituent element. Other constituent elements may include switches, resistors, capacitors, and the like. In describing the embodiments, the term "connected" means electrically connected, unless the expression "directly connected" is used.

Hereinafter, a battery management method, a battery management device, and a battery pack performing the same according to an embodiment will be described in detail with reference to the drawings.

Referring to FIG. 1, a battery pack 10 according to an embodiment may include a battery 11 and a battery management device for managing balancing of the battery 11. The battery management device may include a detection device 12, a balancing device 13, and a control device 14.

The battery 11 may include a plurality of battery modules 111 connected in series with each other. The plurality of battery modules 111 may be connected in series or parallel to each other. Each battery module 111 may include a plurality of cells connected in series or parallel to each other.

The detection device 12 may detect state information representing the state of the battery 11 by sensing the state (voltage, current, temperature, etc.) of the battery 11. The detection device 12 may detect the voltage of each cell or each battery module 111 included in the battery 11. The detection device 12 may detect a current flowing through the battery module 111 or each battery module 111 included in the battery 11. The detection device 12 may detect the temperature of at least one point of the battery 11. The balancing device 13 may perform a balancing operation of battery cells included in the battery 11.

The control device 14 may receive state information (voltage, current, temperature) of the battery module 111 from the detection device 12. The control device 14 may monitor the state (voltage, current, temperature, state of charge (SOC), state of health (SOH), etc.) of the battery module 111 based on the state information received from the detection device 12. In addition, the control device 14 may perform a control function (e.g., temperature control, balancing control, charge/discharge control, etc.) and a protection function (e.g., over-discharge, overcharge, overcurrent protection, etc.), and the like, based on the state monitoring result. In addition, the control device 14 may perform a communication function with an external device (e.g., an upper controller) of the battery pack 10.

The control device 14 may detect whether the battery module 111 included in the battery 11 has been replaced, and if a replacement of the battery module 111 is detected, the control device 14 may control a charge/discharge operation and a protection operation of the battery 11 so that a voltage imbalance between the replaced battery module 111 and the existing battery module 111 may be quickly resolved. The control device 14 may include a replacement detector 141, a charge/discharge controller 142, a balancing controller 143, and a protector 144.

The replacement detector 141 may detect replacement of the battery module 111 included in the battery 11. The replacement detection operation of the battery module 111 may be performed in various ways.

In an implementation, replacement information of the battery module 111 may be input to the replacement detector 141 of the control device 14 by a worker who has performed a replacement operation of the battery pack 10. The worker may input identification information or position information of the replaced battery module 111 using an input device, and the input information may be transmitted from the input device to the replacement detector 141 of the control device 14.

The worker may input identification information or position information of the replaced battery module 111 to a worker terminal or an upper controller of the battery pack 10, and the input information may be transmitted from the worker terminal or the upper controller to the replacement detector 141 of the control device 14 by wired/wireless communication.

Further, for example, the replacement detector 141 may receive unique identification information (e.g., serial number, etc.) to identify each battery module 111 from the battery modules 111 included in the battery 11 and may detect a replacement of the battery module 111 based on the identification information. The replacement detection portion 141 may compare the identification information of the battery modules 111 stored in the internal memory of the battery pack 10 with the newly received identification information from the battery modules 111 and may determine that the corresponding battery module 111 has been replaced if identification information different from the identification information stored in the memory is received from at least one battery module (111).

If replacement of at least one battery module 111 is detected by the replacement detector 141, the control device 14 may switch from a normal mode to a replacement mode (i.e., a retrofit mode). The normal mode may be an operation mode of the control device 14 in which the battery module 111 has not been replaced, and the replacement mode may be an operation mode of the control device 14 in which at least one battery module 111 has been replaced.

The charge/discharge controller 142 may control charge/discharge of the battery 11. In the normal mode, both charge and discharge of the battery 11 may be allowed. In the normal mode, the charge/discharge controller 142 may control the battery 11 to be charged or discharged according to the state of the battery 11. In the replacement mode, only one operation of charge and discharge of the battery module 111 may be allowed. For example, if the control device 14 operates in the replacement mode, the charge/discharge controller 142 may allow only charge of the battery 11 and limit discharge of the battery 11. In addition, for example, the charge/discharge controller 142 may allow only discharge of the battery 11 and limit charge of the battery 11 if the control device 14 operates in the replacement mode. In this way, if only one of charge and discharge is allowed in the replacement mode, voltage imbalance due to replacement of the battery module 111 may be quickly resolved. Which operation of charge and discharge to be performed in the replacement mode may be previously set by the user, and the charge/discharge controller 142 may allow only one operation of charge and discharge according to predetermined setting information.

The balancing controller 143 may control a balancing operation of the balancing device 13 based on state information of the battery 11 received through the detection device 12. The balancing controller 143 may control the balancing device 13 so that the balancing of the battery cells is performed in at least one of a top balancing method and a bottom balancing method according to predetermined setting information. Top balancing may be a balancing method in which cell voltages of battery cells are equalized in a region where cell voltages are high, and bottom balancing is a balancing method in which cell voltages of battery cells are equalized in a region where cell voltages are low. In the case of top balancing, the balancing controller 143 may control the balancing device 13 to perform balancing while the battery 11 is being charged or while the battery 11 is in a standby state after reaching a full-charge state. In the case of bottom balancing, the balancing controller 143 may control the balancing device 13 to perform balancing while the battery 11 is being discharged or while the battery 11 is in a standby state after reaching a full-discharge state.

If only charging of the battery 11 is allowed in the replacement mode, the balancing controller 143 may control the balancing device 13 to perform balancing of battery cells in the top balancing method. If only discharging of the battery 11 is allowed in the replacement mode, the balancing controller 143 may control the balancing device 13 to perform balancing of battery cells in the bottom balancing method. If balancing of the battery cells in the replacement mode is completed, the control device 14 may release the replacement mode and return to the normal mode.

The protector 144 may detect an imbalance state of the battery cells included in the battery 11 and perform a protection operation accordingly. The protector 144 may perform a module imbalance protection function and a pack imbalance protection function.

The module imbalance protection function may detect an imbalance state of the battery cells for each battery module 111, and may perform a protection operation (e.g., blocking the charge/discharge of the battery 11) if the imbalance state of the battery cells in at least one battery module 111 satisfies a predetermined condition.

In an implementation, the module imbalance protection function may be a function for detecting an imbalance state of battery cells in units of battery modules and performing a protection operation accordingly. In an implementation, if the module imbalance protection function is activated, the protector 144 may detect a battery cell having the maximum cell voltage and a battery cell having the minimum cell voltage for each battery module 111 included in the battery 11, and perform a protection operation if there is a battery module 111 in which a voltage difference (ΔV) between the maximum cell voltage and the minimum cell voltage detected in this way is greater than a threshold value.

If the module imbalance protection function is activated, the protector 144 may detect a battery cell having the maximum SOC and a battery cell having the minimum SOC for each battery module 111 included in the battery 11, and perform a protection operation if there is a battery module 111 in which a SOC difference (ΔSOC) between the maximum SOC and the minimum SOC detected in this way is greater than a threshold value.

The pack imbalance protection function may detect an imbalance state of all the battery cells included in the battery 11, and may perform a protection operation (e.g., blocking the charge/discharge of the battery 11) if the imbalance state detected in all the battery cells satisfies a predetermined condition. In an implementation, the pack imbalance protection function may be a function for detecting an imbalance state of battery cells on a per battery pack basis and performing a protection operation accordingly. In an implementation, if the pack imbalance protection function is activated, the protector 144 may detect a battery cell having the maximum cell voltage and a battery cell having the minimum cell voltage among all the battery cells included in the battery 11, and perform a protection operation if the voltage difference (ΔV) between the maximum cell voltage and the minimum cell voltage detected in this way is greater than a threshold value. If the pack imbalance protection function is activated, the protector 144 may detect a battery cell having the maximum SOC and a battery cell having the minimum SOC among all the battery cells included in the battery 11, and perform a protection operation if the SOC difference (ΔSOC) between the maximum SOC and the minimum SOC detected in this way is greater than a threshold value.

If some of the battery modules 111 included in the battery 11 are replaced, if the pack imbalance protection function is activated, the protection operation may be performed essentially due to the state imbalance between the battery cells of the replaced battery module 111 and the battery cells of the existing battery module 111. This protection operation may also affect the performance of cell balancing operation. Therefore, the protector 144 may control activation of the pack imbalance protection function and the module imbalance protection function according to the operation mode of the control device 14. In an implementation, if the control device 14 operates in the normal mode, the protector 144 may activate only the pack imbalance protection function or activate both the pack imbalance protection function and the module imbalance protection function. If the control device 14 operates in the replacement mode, the protector 144 may deactivate the pack imbalance protection function and activate only the module imbalance protection function. In this way, the protector 144 may improve the balancing speed by preventing unnecessary protection operations from being performed by deactivating the pack imbalance protection function in the replacement mode. On the other hand, the protector 144 may secure safety by activating the module imbalance protection function in the replacement mode.

The protector 144 may deactivate each protection function by raising a threshold value compared to the voltage difference (ΔV) or the SOC difference (ΔSOC) to a very high value in relation to each protection function (pack imbalance protection function and module imbalance protection function). In other words, by raising the threshold value to a very high value, the voltage difference (ΔV) or the SOC difference (ΔSOC) will necessarily be lower than this threshold value, and therefore the protection function will necessarily be deactivated.

The protector 144 may also deactivate each protection function by not calling a function performing each protection function (pack imbalance protection function, module imbalance protection function). The control device 14 having the above configuration may be implemented by a battery management system (BMS) of the battery pack 10.

Hereinafter, a battery management method according to an embodiment will be described in detail with reference to FIGS. 2 to 4. The methods shown in FIGS. 2 to 4 may be performed by the control device 14 described with reference to FIG. 1.

Figure 2:
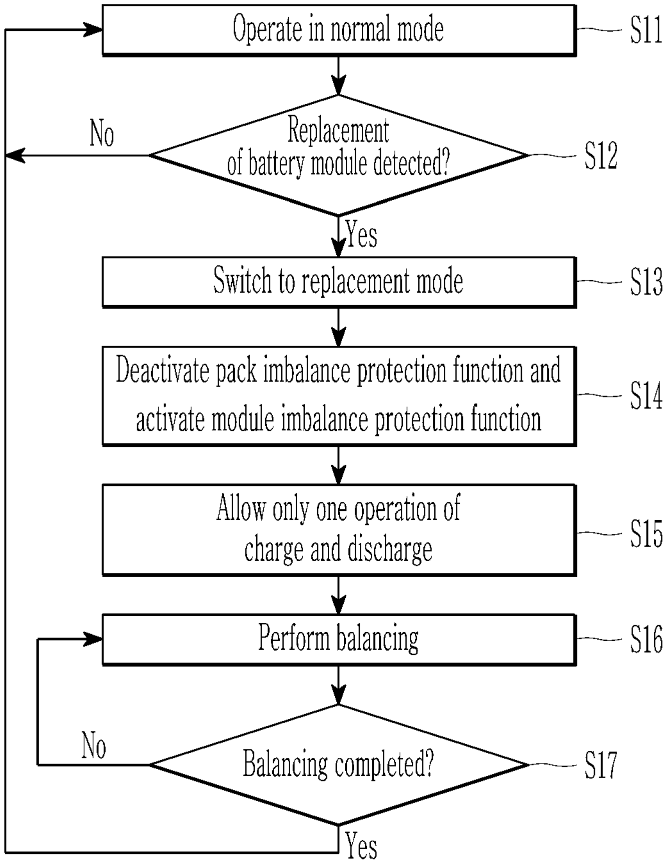
FIG. 2 is a flow diagram showing a battery management method for a battery pack according to an example embodiment.

FIG. 2 shows a battery management method for the battery pack according to an example embodiment. Referring to FIG. 2, the control device 14 may switch to the replacement mode (S13) if a replacement of at least one battery module 111 included in the battery 11 is detected (S12) while operating in the normal mode (S11).

In the S12, the control device 14 may detect replacement of the battery module 111 by various methods. In an implementation, the control device 14 may receive replacement information of the battery module 111 from a worker through an input device or receive exchange information of the battery module 111 from an external terminal or an upper controller through wired/wireless communication. In an implementation, the control device 14 may receive unique identification information (e.g., serial number, etc.) to identify each battery module 111 from the battery modules 111 included in the battery 11 and detect a replacement of the battery module 111 based on the identification information.

As the control device 14 operates in the replacement mode, the control device 14 may deactivate the pack imbalance protection function and activate the module imbalance protection function (S14). The module imbalance protection function may be a function that performs a protection operation according to an imbalance state of battery cells in units of the battery modules 111, and the pack imbalance protection function may be a function that performs a protection operation according to an imbalance state of all the battery cells included in the battery pack 10. A method for performing the module imbalance protection function and a method for performing the pack imbalance protection function will be described in detail with reference to FIGS. 3 and 4 below.

As the control device 14 operates in the replacement mode, the control device 14 may allow only one operation of charge and discharge (S15). In an implementation, the control device 14 may allow only charge of the battery 11 and block discharge of the battery 11. In an implementation, the control device 14 may allow only discharge of the battery 11 and block charge of the battery 11.

The control device 14 may perform cell balancing of the battery 11 by controlling the balancing device 13 in a state where only one operation of charge and discharge is allowed (S16). In an implementation, if only charge of the battery 11 is allowed in the replacement mode, the control device 14 may control the balancing device 13 to perform balancing of the battery cells in a top balancing method during charge or during a standby time after full-charge of the battery 11. If only discharge of the battery 11 is allowed in the replacement mode, the control device 14 may control the balancing device 13 to perform balancing of the battery cells in a bottom balancing method during discharge or during a standby time after full-discharge of the battery 11. If the balancing of the battery cells in the replacement mode is completed (S17), the control device 14 may release the replacement mode and operate in the normal mode again.

Figure 3:
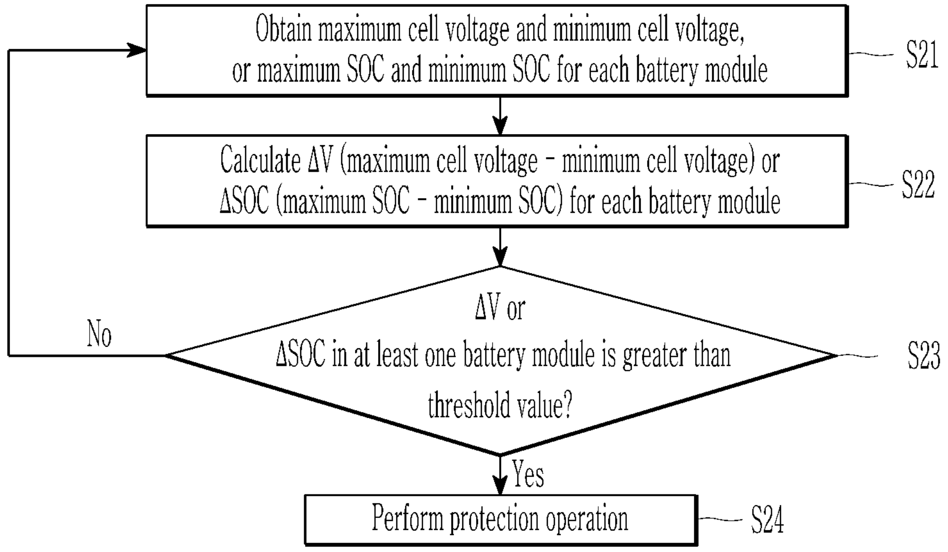
FIG. 3 is a flow diagram showing a method of performing a module imbalance protection function of a battery pack according to an example embodiment.

FIG. 3 shows a method of performing a module imbalance protection function of the battery pack according to an example embodiment. Referring to FIG. 3, the control device 14 may obtain the maximum cell voltage and the minimum cell voltage, or the maximum SOC and the minimum SOC for each battery module 111 (S21).

In the S21, the control device 14 may detect cell voltages of the battery cells included in each battery module 111 through the detection device 12 and select the maximum cell voltage and the minimum cell voltage among the detected cell voltages for each battery module 111. In addition, the control device 14 may detect the SOC of the battery cells included in each battery module 111 based on the state information detected through the detection device 12 and select the maximum SOC and the minimum SOC among the detected SOCs for each battery module 111.

Thereafter, the control device 14 may calculate the voltage difference (ΔV) between the maximum cell voltage and the minimum cell voltage, or the SOC difference (ΔSOC) between the maximum SOC and the minimum SOC for each battery module 111 (S22). If the voltage difference (ΔV) or the SOC difference (ΔSOC) calculated through the S22 in at least one battery module 111 is greater than a threshold value (S23), the control device 14 may determine that a protection operation is required and perform the protection operation (S24). In an implementation, the control device 14 may block charge and discharge of the battery 11.

Figure 4:
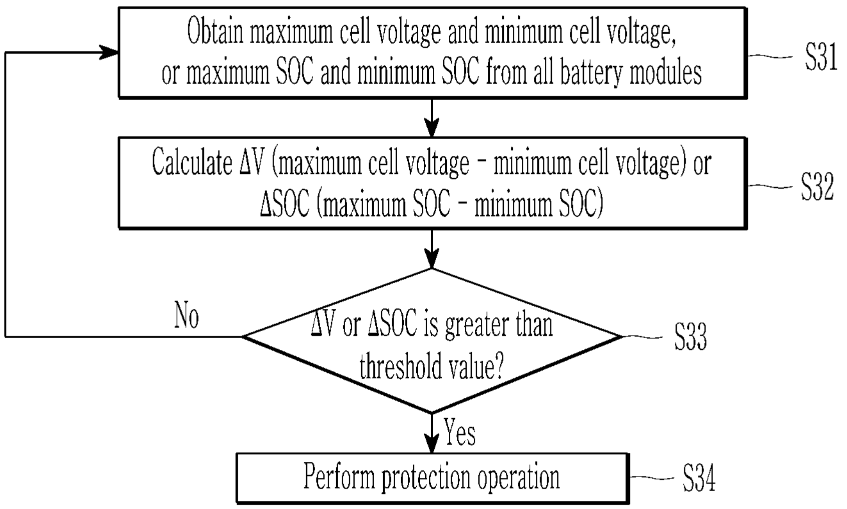
FIG. 4 is a flow diagram showing a method of performing a pack imbalance protection function of a battery pack according to an example embodiment.

FIG. 4 shows a method of performing a pack imbalance protection function of the battery pack according to an example embodiment. Referring to FIG. 4, the control device 14 may obtain the maximum cell voltage and the minimum cell voltage, or the maximum SOC and the minimum SOC, respectively, from all the battery modules 111 included in the battery pack 10 (S31).

In the S31, the control device 14 may detect cell voltages of battery cells included in all the battery modules 111 through the detection device 12 and select a maximum cell voltage and a minimum cell voltage among the detected cell voltages. The control device 14 may detect the SOCs of the battery cells included in all the battery modules 111 based on the state information detected through the detection device 12 and select the maximum SOC and the minimum SOC among the detected SOCs.

Thereafter, the control device 14 may calculate a voltage difference (ΔV) between the maximum cell voltage and the minimum cell voltage, or a SOC difference (ΔSOC) between the maximum SOC and the minimum SOC for all the battery modules 111 (S32). If the voltage difference (ΔV) or the SOC difference (ΔSOC) calculated through the S32 is greater than a threshold value (S33), the control device 14 may determine that a protection operation is required and perform the protection operation (S34). For example, the control device 14 may block charge and discharge of the battery 11.

According to the above-described embodiment, it is possible to replace the battery module without performing a pre-balancing operation to resolve state imbalance between the new battery module and the existing battery modules before replacing the battery module 111. In addition, if the battery module is replaced, imbalance state of the battery modules can be quickly resolved.

An electronic or electrical device and/or any other related device or constituent element according to embodiments of the present disclosure described herein can be implemented using any suitable hardware, firmware (e.g., application-specific integrated circuits), software, or a combination of software, firmware, and hardware. For example, the elements of various configurations of the devices can be formed on a single integrated circuit (IC) chip or on separate IC chips. In addition, the elements of various configurations of the devices can be implemented as a flexible printed circuit film, a tape carrier package (TCP), or a printed circuit board (PCB), or may be implemented on a single substrate. The electrical connection or interconnection described in the present specification can be implemented by wire or conductive elements on, for example, a PCB or other type of circuit carrier. The conductive element may include metallizations such as surface metallizations and/or pins, and may include conductive polymers or ceramics.

In addition, the various configurations elements of the devices may be a process or a thread that runs on at least one processor and at least one computing device to perform the various functions described herein, executes computer program instructions, and interacts with other system constituent elements. The computer program instructions are stored in a memory that can be implemented in a computing device using standard memory devices, such as a random access memory (RAM). The computer program instructions may also be stored on other non-transitory computer readable media such as, for example, a CD-ROM, a flash drive, and the like.

By way of summation and review, a low-capacity secondary battery may be used as a power supply for small electronic devices such as mobile phones, laptop computers, and camcorders, and a high-capacity secondary battery may be used as a power supply for hybrid vehicles.

In general, a secondary battery cell may include an electrode assembly including a positive electrode, a negative electrode, and a separator interposed between the positive electrode and the negative electrode, a case accommodating the electrode assembly, and an electrode terminal electrically connected to the electrode assembly. An electrolyte solution may be injected into the case to enable charge/discharge of the battery cell by electrochemical reaction between the positive electrode, the negative electrode, and the electrolyte solution. The shape of the case, such as a cylindrical or a rectangle shape, may depend on the use of the battery cell.

Battery cells may be connected in series and/or parallel to form a battery module having high energy density. A battery pack may include one or more of these battery modules according to required specifications.

Conventionally, even if one of the battery cells or battery modules configuring the battery pack fails, the entire battery pack may have to be replaced, resulting in excessive replacement cost. Accordingly, attempts have recently been made to replace only a battery cell or battery module in which a failure occurs. A battery management method, a battery management device, and a battery pack performing the same capable of replacing only a battery module in which a failure occurs, and quickly performing state balancing such as voltage or capacity between the replaced battery module and existing battery modules if the battery module is replaced.

It is possible to replace only a battery module in which a failure occurred, and quickly perform balancing between the replaced battery module and existing battery modules if the battery module is replaced. In addition, while balancing is performed due to battery module replacement, unnecessary protection operations may be prevented from being performed by limiting protection operations on a per pack basis.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery management device for a battery pack including a plurality of battery modules, comprising:

a detection device detecting state information of battery cells included in the plurality of battery modules; and a control device:

entering a replacement mode and performing balancing of the plurality of battery modules if at least one battery module among the plurality of battery modules is replaced, activating a first protection function performing a protection operation according to a state imbalance in each battery module while operating in the replacement mode, detecting an imbalance state of cell voltage or of state of charge for each of the plurality of battery modules based on a state information if the first protection function is activated, and executing the protection operation if a battery module in the imbalance state satisfying a predetermined first condition is detected among the plurality of battery modules.

2. The battery management device as claimed in claim 1, wherein the control device:

obtains a voltage difference between a battery cell having a maximum cell voltage and a battery cell having a minimum cell voltage for each of the plurality of battery modules if the first protection function is activated, and executes the protection operation if a battery module having a voltage difference greater than a threshold value is detected among the plurality of battery modules.

3. The battery management device as claimed in claim 1, wherein the control device:

obtains a state of charge difference between a battery cell having a maximum state of charge and a battery cell having a minimum state of charge for each of the plurality of battery modules if the first protection function is activated, and executes the protection operation if a battery module having a state of charge difference greater than a threshold value is detected among the plurality of battery modules.

4. The battery management device as claimed in claim 1, wherein the control device:

operates in a normal mode before the at least one battery module is replaced or after balancing of the plurality of battery modules is completed in the replacement mode;

activates a second protection function for performing the protection operation according to a state imbalance in the battery pack while operating in the normal mode;

detects an imbalance state of cell voltage or state of charge in all the plurality of battery modules based on the state information if the second protection function is activated; and executes the protection operation if the imbalance state in cell voltage or state of charge in all the plurality of battery modules satisfies a predetermined second condition and the second protection function is activated.

5. The battery management device as claimed in claim 4, wherein the control device:

obtains a voltage difference between a battery cell having a maximum cell voltage and a battery cell having a minimum cell voltage in all the plurality of battery modules if the second protection function is activated, and executes the protection operation if the voltage difference is greater than a threshold value.

6. The battery management device as claimed in claim 4, wherein the control device:

obtains a state of charge difference between a battery cell having a maximum state of charge and a battery cell having a minimum state of charge in all the plurality of battery modules if the second protection function is activated, and executes the protection operation if the state of charge difference is greater than a threshold value.

7. The battery management device as claimed in claim 4, wherein the control device deactivates the second protection function while operating in the replacement mode.

8. The battery management device as claimed in claim 4, wherein the control device deactivates the second protection function by not executing a function for performing the second protection function while operating in the replacement mode.

9. The battery management device as claimed in claim 7, wherein the control device deactivates the second protection function by raising a threshold value for the second condition while operating in the replacement mode so that the protection operation is not executed.

10. The battery management device as claimed in claim 7, wherein the control device deactivates the first protection function while operating in the normal mode.

11. The battery management device as claimed in claim 1, wherein the control device detects replacement of a battery module based on replacement information received from at least one of an input device, an external terminal, or an upper controller.

12. The battery management device as claimed in claim 1, wherein the control device detects replacement of a battery module by comparing identification information received from the plurality of battery modules with pre-stored identification information.

13. The battery management device as claimed in claim 1, wherein the control device allows only one of charge and discharge of the plurality of battery modules while operating in the replacement mode.

14. A battery pack, comprising:
- a plurality of battery modules connected in series with each other; and
- a detection device detecting state information of battery cells included in the plurality of battery modules; and
- a control device:
  - entering a replacement mode and performing balancing of the plurality of battery modules if at least one battery module among the plurality of battery modules is replaced,
  - activating a first protection function performing a protection operation according to the state imbalance in each battery module while operating in the replacement mode,
  - detecting an imbalance state of cell voltage or state of charge for each of the plurality of battery modules based on the state information if the first protection function is activated, and
  - executing the protection operation if a battery module in the imbalance state satisfying a predetermined first condition is detected among the plurality of battery modules.

15. A battery management method for a battery pack including a plurality of battery modules, comprising:
- switching to a replacement mode as replacement of the battery module is detected;
- performing balancing of the plurality of battery modules while allowing only one of charge and discharge while operating in the replacement mode; and
- performing a first protection function including executing a protection operation according to a state imbalance in each battery module while operating in the replacement mode, the performing of the first protection function including:
  - obtaining a first imbalance state of cell voltage or state of charge for each of the plurality of battery modules; and
  - executing the protection operation if a battery module in the first imbalance state satisfies a predetermined first condition among the plurality of battery modules.

16. The battery management method as claimed in claim 15, wherein the obtaining of the first imbalance state includes:
- obtaining a voltage difference between a battery cell having a maximum cell voltage and a battery cell having a minimum cell voltage for each of the plurality of battery modules; or
- obtaining a state of charge difference between a battery cell having a maximum state of charge and a battery cell having a minimum state of charge for each of the plurality of battery modules; and
- the executing of the protection operation includes:
  - executing the protection operation if a battery module having the voltage difference greater than a threshold value is detected among the plurality of battery modules; or
  - executing the protection operation if a battery module having the state of charge difference greater than a threshold value is detected among the plurality of battery modules.

17. The battery management method as claimed in claim 15, further comprising:
- operating in a normal mode if the replacement of the battery module is not detected;
- controlling charge and discharge of the plurality of battery modules according to states of the plurality of battery modules while operating in the normal mode; and
- performing a second protection function including executing the protection operation according to a state imbalance in all the plurality of battery modules while operating in the normal mode,
- wherein the performing of the second protection function includes:
  - obtaining a second imbalance state of cell voltage or state of charge for all the plurality of battery modules; and
  - executing the protection operation if the second imbalance state satisfies a predetermined second condition.

18. The battery management method as claimed in claim 17, wherein the obtaining of the second imbalance state includes:
- obtaining a voltage difference between a battery cell having a maximum cell voltage and a battery cell having a minimum cell voltage in all the plurality of battery modules; or
- obtaining a state of charge difference between a battery cell having a maximum state of charge and a battery cell having a minimum state of charge in all the plurality of battery modules; and
- the executing of the protection operation includes:
  - executing the protection operation if the voltage difference is greater than a threshold value; or
  - executing the protection operation if the state of charge difference is greater than a threshold value.

19. The battery management method as claimed in claim 17, further comprising deactivating the second protection function while operating in the replacement mode.

20. The battery management method as claimed in claim 15, further comprising detecting replacement of a battery module based on replacement information received from at least one of an input device, an external terminal, or an upper controller.

* * * * *